(12) United States Patent
Bai et al.

(10) Patent No.: US 12,219,697 B2
(45) Date of Patent: Feb. 4, 2025

(54) DISPLAY ASSEMBLY AND DISPLAY DEVICE EACH INCLUDING FLEXIBLE CIRCUIT BOARD WITH REINFORCEMENT PLATE HAVING WAVE SHAPED EDGE

(71) Applicant: BOE TECHNOLOGY GROUP CO., LTD., Beijing (CN)

(72) Inventors: Xiao Bai, Beijing (CN); Shengji Yang, Beijing (CN); Kuanta Huang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 637 days.

(21) Appl. No.: 17/598,232

(22) PCT Filed: Apr. 9, 2021

(86) PCT No.: PCT/CN2021/086177
§ 371 (c)(1),
(2) Date: Sep. 24, 2021

(87) PCT Pub. No.: WO2021/238443
PCT Pub. Date: Dec. 2, 2021

(65) Prior Publication Data
US 2022/0322524 A1    Oct. 6, 2022

(30) Foreign Application Priority Data
May 25, 2020    (CN) .......................... 202010452026.5

(51) Int. Cl.
H05K 1/02    (2006.01)
H05K 1/18    (2006.01)
(Continued)

(52) U.S. Cl.
CPC ............ H05K 1/0281 (2013.01); H05K 1/189 (2013.01); H10K 59/131 (2023.02); *H01L 24/05* (2013.01);
(Continued)

(58) Field of Classification Search
CPC ................. H05K 1/0281; H05K 1/189; H05K 2201/10128; H05K 2201/2009;
(Continued)

(56) References Cited

U.S. PATENT DOCUMENTS

2014/0240370 A1 *   8/2014   Sakairi ................. G09G 3/3225
                                                            29/592
2015/0077950 A1 *   3/2015   Tashiro .................. H05K 3/323
                                                            361/749

FOREIGN PATENT DOCUMENTS

CN          1591107 A        3/2005
CN          101056512 A      10/2007
(Continued)

OTHER PUBLICATIONS

Machine Translation of WO-2017204553-A1 (Year: 2017).*
(Continued)

*Primary Examiner* — Benjamin P Sandvik
*Assistant Examiner* — John Patrick Cornely
(74) *Attorney, Agent, or Firm* — HOUTTEMAN LAW LLC

(57) ABSTRACT

A display assembly includes: a display panel including a driving circuit and a first pad; and a flexible circuit board including a flexible base plate, a first wiring layer and a first reinforcement plate. The first wiring layer is on the flexible base plate and includes a main routing portion and a second pad, and the first reinforcement plate is on a side of the first wiring layer distal to the flexible base plate; an orthogonal projection of the main routing portion on the flexible base
(Continued)

plate is within an orthogonal projection of the first reinforcement plate on the flexible base plate; the second pad is connected to the main routing portion, and is electrically connected to the first pad; the first reinforcement plate is outside the display panel and has a first edge proximal to the display panel The first edge includes convex and concave portions alternately arranged.

17 Claims, 3 Drawing Sheets

(51) Int. Cl.
*H10K 59/131* (2023.01)
*H01L 23/00* (2006.01)
(52) U.S. Cl.
CPC .... *H01L 24/32* (2013.01); *H01L 2224/05571* (2013.01); *H01L 2224/05573* (2013.01); *H01L 2224/05624* (2013.01); *H01L 2224/05647* (2013.01); *H01L 2224/05666* (2013.01); *H01L 2224/0568* (2013.01); *H01L 2224/32227* (2013.01); *H05K 2201/10128* (2013.01); *H05K 2201/2009* (2013.01)
(58) Field of Classification Search
CPC ...... H05K 3/323; H10K 59/131; H10K 50/80; H10K 50/84; H01L 24/05; H01L 24/32; H01L 2224/05571; H01L 2224/05573; H01L 2224/05624; H01L 2224/05647; H01L 2224/05666; H01L 2224/0568; H01L 2224/32227; G09F 9/301
See application file for complete search history.

(56) References Cited

FOREIGN PATENT DOCUMENTS

| | | | |
|---|---|---|---|
| CN | 105242802 A | 1/2016 | |
| CN | 110825268 A | 2/2020 | |
| CN | 212660364 U | 3/2021 | |
| JP | 2005311106 A | 11/2005 | |
| WO | WO-2017204553 A1 * | 11/2017 | ............... H05K 1/03 |

OTHER PUBLICATIONS

European Patent Office, Extended European search report, issued Apr. 12, 2023 for application No. EP21813156.3.
China Patent Office, First Office Action issued Mar. 25, 2022 for application No. CN202010452026.5.

* cited by examiner

DISPLAY ASSEMBLY AND DISPLAY DEVICE EACH INCLUDING FLEXIBLE CIRCUIT BOARD WITH REINFORCEMENT PLATE HAVING WAVE SHAPED EDGE

CROSS-REFERENCE TO RELATED APPLICATIONS

This is a National Phase Application filed under 35 U.S.C. 371 as a national stage of PCT/CN2021/086177 filed on Apr. 9, 2021 an application claiming priority to Chinese patent application No. 202010452026.5, filed on May 25, 2020, the content of each of which is incorporated herein by reference in its entirety.

TECHNICAL FIELD

The present disclosure relates to the field of display technology, and in particular to a display assembly and a display device.

BACKGROUND

With the increasing progress of virtual reality (VR) technology and augmented reality (AR) technology, a display device suitable for VR/AR field is also developing towards miniaturization, high pixel density (i.e., pixel per inch (PPI)), fast response and high color gamut. A silicon-based micro-display OLED (organic light-emitting diode) panel is the prominent one of such kind of display devices.

In order to facilitate the assembling of an assembly, a flexible printed circuit (FPC) board is a main means for connection between the silicon-based OLED and a driving terminal. Thus, there are higher requirements on the design of the flexible circuit board and a bonding process between the flexible circuit board and the silicon-based OLED.

SUMMARY

Some embodiments of the present disclosure provide a display assembly and a display device.

A first aspect of the present disclosure provides a display assembly, including:
- a display panel including a display region and a bonding region on at least one side of the display region, wherein the display panel includes: a substrate, a driving circuit, and a first pad, the driving circuit and the first pad are on the substrate, and the first pad is in the bonding region; the driving circuit is electrically connected to the first pad, and at least includes a transistor in the display region, and a semiconductor layer of the transistor is embedded in the substrate;
- a flexible circuit board, including: a flexible base plate, a first wiring layer and a first reinforcement plate, wherein the first wiring layer is on the flexible base plate and includes a main routing portion and a second pad, and the first reinforcement plate is on a side of the first wiring layer distal to the flexible base plate;
- wherein an orthogonal projection of the main routing portion on the flexible base plate is within an orthogonal projection of the first reinforcement plate on the flexible base plate; the second pad is connected to the main routing portion, at least one part of the second pad is electrically connected to the first pad through a conductive adhesive, and the conductive adhesive includes conductive particles; and
- in a first direction, the first reinforcement plate is outside the display panel, has a first edge proximal to the display panel; the first edge includes: convex portions bent towards the display panel, and concave portions bent away from the display panel, and the concave portions and the convex portions are alternately arranged in a second direction to form a wave shape; the first direction is a direction in which the second pad is away from the display panel, and the second direction intersects with the first direction.

In some embodiments, the convex portions and the concave portions are both arc-shaped.

In some embodiments, the convex portions and the concave portions each have a radius between 1.0 mm and 1.5 mm.

In some embodiments, an arc length of each of the convex portions and an arc length of each of the concave portions are both between 1.0 mm and 1.6 mm.

In some embodiments, a length of each of the convex portions in the second direction is equal to a length of each of the concave portions in the second direction.

In some embodiments, any position of the first edge is spaced apart from the display panel by an interval.

In some embodiments, the interval between any position of the first edge and the display panel is between 200 μm and 1500 μm.

In some embodiments, the flexible circuit board further includes a second reinforcement plate on a side of the flexible base plate distal to the first wiring layer, and at least including a first reinforcement portion, and an orthogonal projection of the second pad on the flexible base plate is within an orthogonal projection of the first reinforcement portion on the flexible base plate.

In some embodiments, the second reinforcement plate further includes a second reinforcement portion; the second reinforcement portion and the first reinforcement portion are sequentially arranged in the first direction, and an orthogonal projection of the second reinforcement portion on the flexible base plate is within an orthogonal projection of the first reinforcement plate on the flexible base plate.

In some embodiments, the first reinforcement portion and the second reinforcement portion of the second reinforcement plate are formed a single piece.

In some embodiments, a dimension of the second reinforcement portion in the first direction is not less than 500 μm.

In some embodiments, the flexible circuit board further includes a second wiring layer and a third reinforcement plate, wherein the second wiring layer is on a side of the flexible base plate distal to the first wiring layer and is electrically connected to the main routing portion through a via; the third reinforcement plate is on a side of the second wiring layer distal to the flexible base plate;

wherein an orthogonal projection of the second wiring layer on the flexible base plate is within an orthogonal projection of the first reinforcement plate on the flexible base plate, and is within an orthogonal projection of the third reinforcement plate on the flexible base plate.

In some embodiments, the third reinforcement plate and the second reinforcement plate have an interval therebetween.

In some embodiments, a part of the third reinforcement plate is on a side of the second wiring layer proximal to the second reinforcement portion.

In some embodiments, the conductive adhesive is an anisotropic conductive adhesive.

In some embodiments, the display panel further includes:

a light-emitting element in the display region and on a side of the driving circuit distal to the substrate, and electrically connected to the transistor.

The embodiments of the present disclosure further provide a display device, which includes the display assembly according to any one of the foregoing embodiments of the present disclosure.

BRIEF DESCRIPTION OF DRAWINGS

The accompanying drawings, which are provided for further understanding of the present disclosure and constitute a part of this specification, are for explaining the present disclosure together with the following exemplary embodiments, but are not intended to limit the present disclosure. In the drawings.

DETAIL DESCRIPTION OF EMBODIMENTS

The detailed description of the embodiments of the present disclosure will be described in detail with reference to the accompanying drawings. It should be understood that the detailed description of the embodiments described herein are only used to illustrate and explain the present disclosure, not to limit the present disclosure.

In order to make the objects, technical solutions and advantages of the present disclosure more apparent, the technical solutions of the embodiments of the present disclosure will be described clearly and integrally below with reference to the accompanying drawings of the embodiments of the present disclosure. Obviously, the described embodiment is only part, not all, of the embodiments in the present disclosure. All other embodiments, which may be obtained by one of ordinary skill in the art without any creative effort based on the described embodiments in the present disclosure, belong to the protection scope of the present invention.

Terms used herein to describe embodiments of the present disclosure are not intended to limit and/or define the scope of the present disclosure. For example, unless defined otherwise, technical or scientific terms used herein should have the same meaning as commonly understood by one of ordinary skill in the art to which the present disclosure belongs. It should be understood that the terms of "first", "second", and the like used in the present disclosure are not intended to indicate any order, quantity, or importance, but rather are used for distinguishing one element from another. Unless the context clearly indicates otherwise, a singular form "a", "an", "the", or the like does not denote a limitation of quantity, but rather denotes the presence of at least one element. The term of "comprising", "including", or the like, means that the element or item preceding the term contains the element or item listed after the term and the equivalent thereof, but does not exclude the presence of other elements or items. The term "connected", "coupled", or the like is not limited to physical or mechanical connections, but may include electrical connections, whether direct or indirect connections. The terms "upper", "lower", "left", "right", and the like are used merely for indicating relative positional relationships, and when the absolute position of an object being described is changed, the relative positional relationships may also be changed accordingly.

Figure 1:
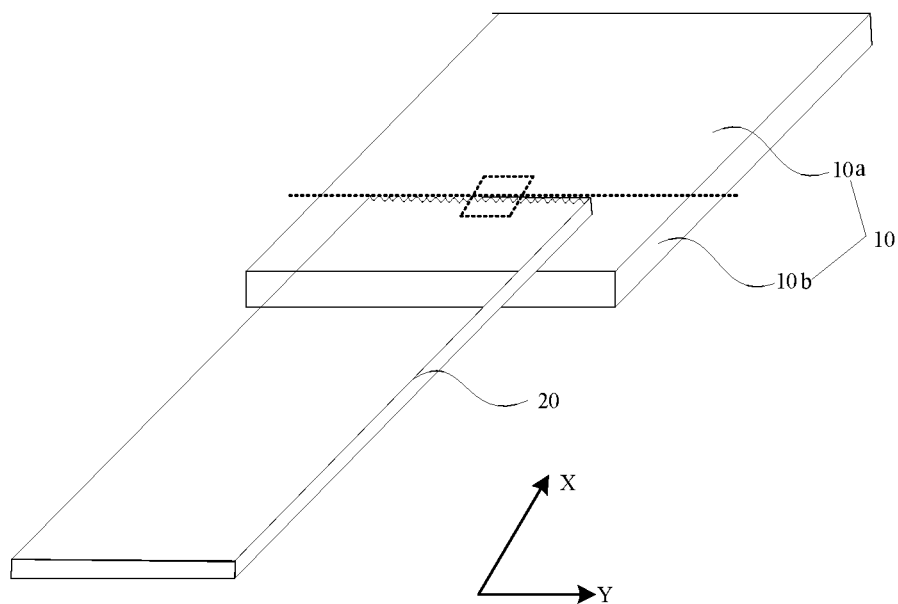
FIG. 1 is a schematic diagram of a display assembly according to some embodiments of the present disclosure.
Figure 2:
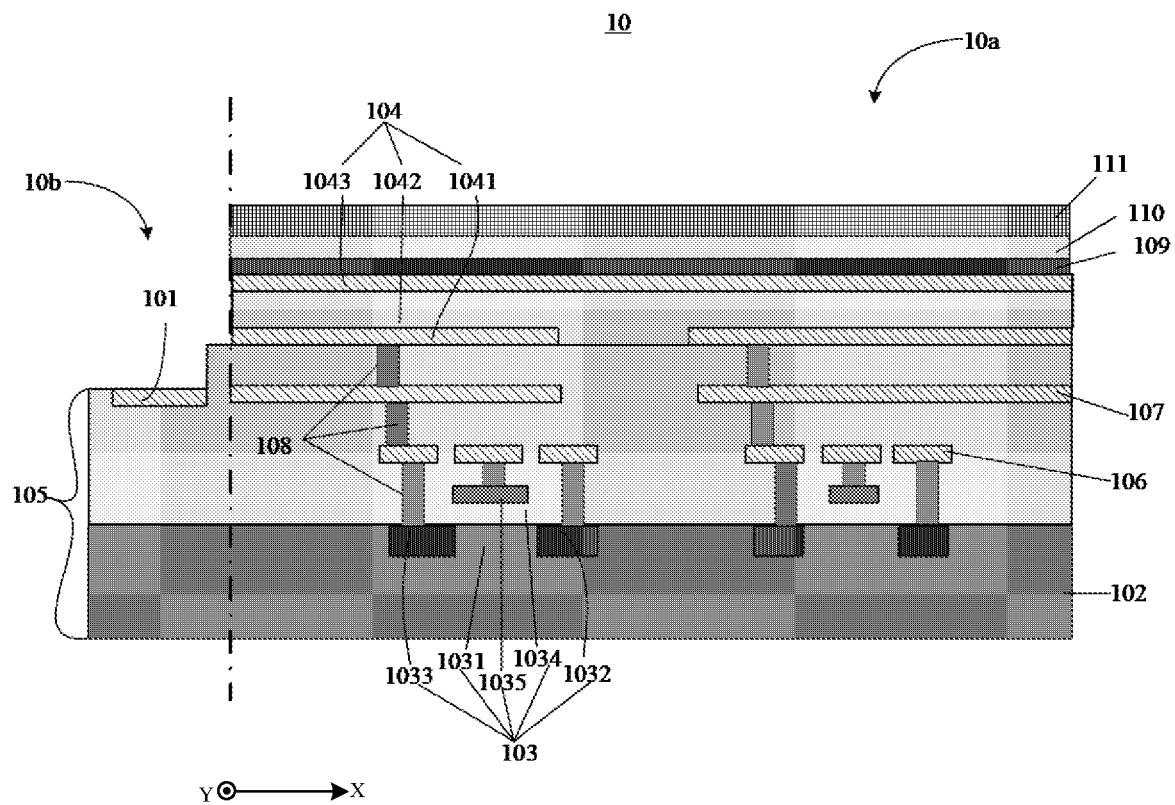
FIG. 2 is a schematic diagram of a display panel according to some embodiments of the present disclosure.

FIG. 1 is a schematic diagram of a display assembly according to some embodiments of the present disclosure. As shown in FIG. 1, the display assembly includes a display panel and a flexible circuit board. FIG. 2 is a schematic diagram of a display panel according to some embodiments of the present disclosure. As shown in FIG. 1 and FIG. 2, the display panel 10 includes a display region 10a and a bonding region 10b located on at least one side of the display region 10a. The display panel 10 includes: a substrate 102, a driving circuit, and a first pad 101, the driving circuit and the first pad 101 being disposed on the substrate 102.

In some embodiments, the first pad 101 is located in the bonding region 10b; the first pad 101 may have a single-layer or multi-layer structure; and the first pad 101 may be made of a metal or an alloy. For example: the first pad 101 may be a single-layer or multi-layer metal structure made of copper, molybdenum, aluminum, titanium, or the like, which is not limited herein. The first pad 101 may be made of any other conductive material. The first pad 101 is generally used to bond to an external element (e.g., a flexible circuit board 20) after manufacturing of the device in the display region 10a is completed, so as to provide signals to the display panel 10. There are a plurality of the first pads, each of which may have a stripe shape. A length direction of the first pad may be along a first direction (an X direction in FIGS. 1 and 2), and the plurality of first pads are arranged along a second direction (a Y direction in FIGS. 1 and 2) intersecting the first direction. For example, the second direction is perpendicular to the first direction.

In some embodiments, the substrate 102 is a silicon-based substrate, such as monocrystalline or high-purity silicon. The driving circuit may be formed on the substrate 102 so that it is integrally formed as a driving substrate 105. It should be understood that the driving circuit may include a circuit structure located in the display region 10a and may also include a circuit structure located in the bonding region 10b. The driving circuit may be electrically connected to the first pad 101 in the bonding region 10b, and the first pad 101 is bonded to a second pad 202a of the flexible circuit board 20 to provide a signal to the display panel 10.

As shown in FIG. 2, the driving circuit may at least include a pixel circuit located in the display region 10a, the pixel circuit includes a plurality of transistors 103, and the pixel circuit may be formed on the silicon-based substrate through a semiconductor process. For example: a semiconductor layer 1031 (i.e., an active layer), a source electrode 1032, and a drain electrode 1033 of the transistor 103 are formed on the silicon-based substrate through a doping process, an insulating layer 1034 is formed through a silicon oxidation process, and a gate electrode 1035 and a plurality of conductive layers 106 and 107 are formed through a sputtering process or other processes. The semiconductor layer 1031 of the transistor 103 is embedded in the substrate 102; that is, when the substrate 102 is the silicon-based substrate, the semiconductor layer 1031 may belong to a portion of the silicon-based substrate.

It should be noted that, the driving circuit may further include a gate driving circuit and a data driving circuit, which are connected to the pixel circuits in the display region 10*a* to provide electric signals to the pixel circuits. For example, the data driving circuit is configured to provide data signals; the gate driving circuit is configured to provide scan signals, and further provide various control signals, power signals, and the like.

The gate driving circuit and the data driving circuit may also be integrated in the silicon-based substrate through the above semiconductor process. That is, the silicon-based substrate is used as the substrate 102 in the display panel 10, and the pixel circuit, the gate driving circuit, and the data driving circuit may be integrated on the silicon-based substrate. In this case, since the silicon-based circuit may achieve higher accuracy, the gate driving circuit and the data driving circuit may be disposed, for example, in a region corresponding to the display region 10*a* of the display panel 10, not necessarily in the non-display region 10*b*.

Optionally, the display panel may further include a plurality of light-emitting elements, for example, organic light-emitting diodes (OLEDs) or micro light-emitting diodes (Micro/Mini OLEDs).

The light-emitting element 104 is provided on a side of the driving circuit distal to the substrate 102 and in the display region 10*a*, and the light-emitting element 104 may be electrically connected to the transistor 103 in the pixel circuit. For example, the light-emitting element 104 may include an anode 1041, a light-emitting layer 1042 and a cathode 1043 sequentially formed on the driving substrate 105, and the anode 1041 may be electrically connected to the drain electrode 1033 of the transistor 103 through a contact hole 108 filled with a conductive material (e.g., metal tungsten, etc.) and the plurality of conductive layers 106 and 107.

Anodes 1041 of the plurality of light-emitting elements 104 are spaced apart from each other, and cathodes 1043 of the light-emitting elements 104 may be formed as a whole film. A pixel defining layer (PDL) may, or may not, be disposed between adjacent anodes 1041, as the case may be.

The first pad 101 on the substrate 102 may be disposed in the same layer as the conductive structure in the display region 10*a* to save processes. For example, the first pad 101 may be provided in the same layer as the conductive layer 107, which is the topmost layer (farthest from the substrate 102) below the light-emitting element 104, in the display region 10*a*.

In some embodiments, the conductive layer 107 is reflective, such as a titanium/titanium nitride/aluminum stack. For example, the conductive layer 107 includes a plurality of sub-layers arranged at intervals, which are arranged in one-to-one correspondence with the anodes 1041 of the light-emitting elements 104. In a top emission structure, the conductive layer 107 may be a reflective layer for reflecting light emitted from the light-emitting elements 104 to improve light outgoing efficiency. For example, an orthogonal projection of the anode 1041 of each light-emitting element 104 on the substrate 102 is within an orthogonal projection of a portion of the conductive layer corresponding to the anode 1041 on the substrate 102. In this case, the anode 1041 may be made of a transparent conductive oxide material having a high work function, for example, ITO (indium tin oxide), IZO (indium zinc oxide), or the like.

In some embodiments, the display panel 10 further includes an encapsulation layer 109, a color film layer 110, a cover plate 111, and the like on a side of the light-emitting element 104 distal to the substrate 102. For example, the first encapsulation layer 109 is configured to seal the light-emitting elements 104 to prevent external moisture and oxygen from permeating and damaging to the light-emitting elements 104 and the pixel circuit. For example, the first encapsulation layer 109 includes an inorganic thin film or a structure in which organic thin films and inorganic thin films are alternately stacked. The color film layer 110 may include R (red), G (green), B (blue) color blocks, etc. The cover plate 111 is, for example, a glass cover plate. The encapsulation layer 109 may alternatively be disposed between the color film layer 110 and the cover plate 111 to encapsulate the color film layer 110.

Figure 3:
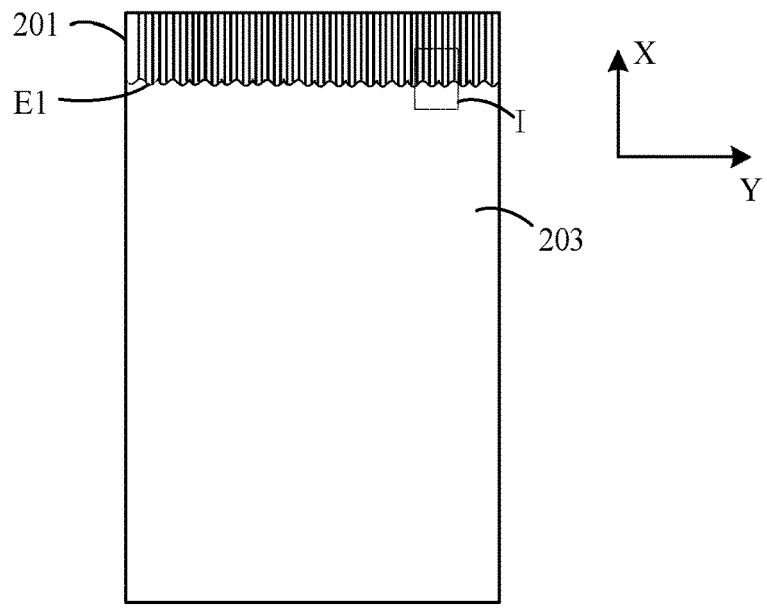
FIG. 3 is a bottom view of a flexible circuit board according to some embodiments of the present disclosure.
Figure 4:
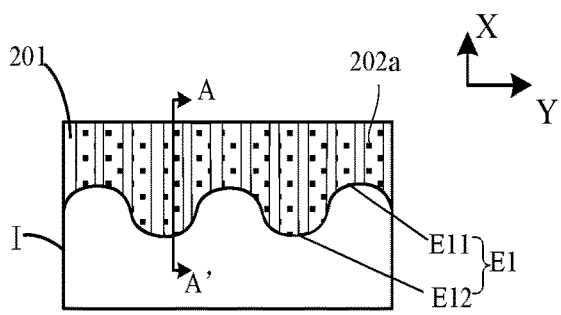
FIG. 4 is an enlarged view of a region I in FIG. 3.
Figure 5:
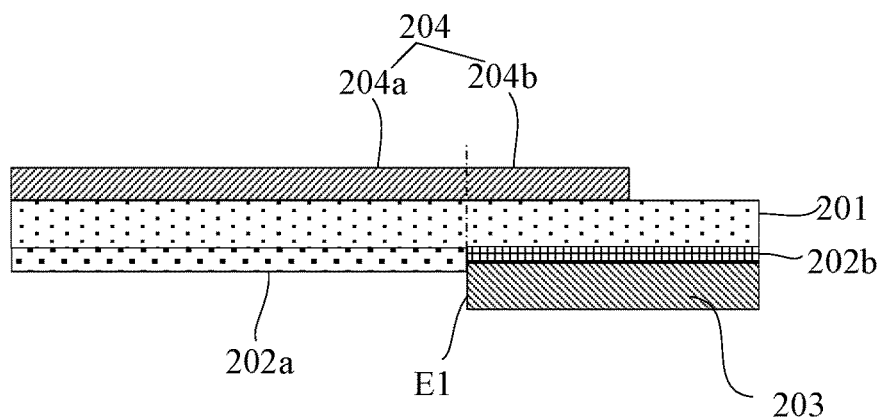
FIG. 5 is a cross-sectional view taken along a line AA' in FIG. 4.
Figure 6:
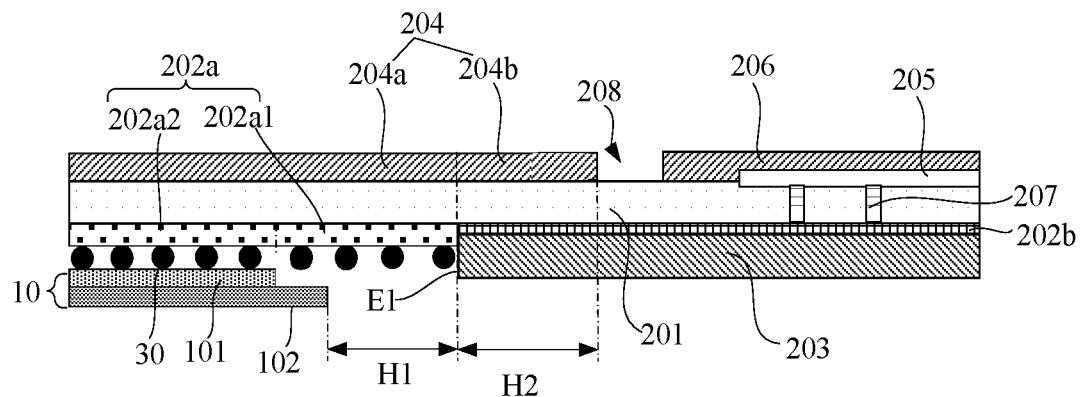
FIG. 6 is a schematic diagram of a connection between a flexible circuit board and a display panel according to some embodiments of the present disclosure.

FIG. 3 is a bottom view of a flexible circuit board according to some embodiments of the present disclosure. FIG. 4 is an enlarged view of a region I in FIG. 3. FIG. 5 is a cross-sectional view taken along a line AA' in FIG. 4. FIG. 6 is a schematic diagram of a connection between a flexible circuit board and a display panel according to some embodiments of the present disclosure. In combination with FIGS. 3 to 6, the flexible circuit board 20 includes a flexible base plate 201, a first wiring layer, and a first reinforcement plate 203. The first wiring layer is disposed on the flexible base plate 201, may include a main routing portion 202*b* and a second pad 202*a*; and the first reinforcement plate 203 is disposed on a side of the first wiring layer distal to the flexible base plate 201.

For example, an orthogonal projection of the main routing portion 202*b* on the flexible base plate 201 is located in an orthogonal projection of the first reinforcement plate 203 on the flexible base plate 201, and the first reinforcement plate 203 may protect the main routing portion 202*b* on the flexible circuit board 20. In addition, the structural stability of the flexible circuit board 20 may be ensured, so that the overall assembly of the product is facilitated.

For example, there are a plurality of second pads 202*a*, which are connected (for example, by way of stitching and bonding) to the first pads 101 in a one-to-one correspondence; a length direction of each second pad 202*a* may be the same as that of the first pad 101, for example, extending along an X direction in FIGS. 1 and 3.

The second pad 202*a* is connected to the main routing portion 202*b*, and at least a portion of the second pad 202*a* is electrically connected to the first pad 101 through a conductive adhesive, wherein the conductive adhesive includes conductive particles 30. For example, the conductive particles 30 are doped in the adhesive. It is to be understood that since a second connection portion 202*a*2 is electrically connected to the first pad 101, an orthogonal projection of at least a portion of the second connection portion 202*a*2 on the flexible base plate 201 does not overlap with the orthogonal projection of the first reinforcement plate 203 on the flexible base plate 201.

For example, as shown in FIG. 6, the second pad 202*a* includes a first connection portion 202*a*1 and a second connection portion 202*a*2 arranged along the length direction of the second pad 202*a*; the first connection portion 202*a*1 is connected to the main routing portion 202*b*; and the second connection portion 202*a*2 is electrically connected to the first pad 101. It should be noted that FIG. 6 shows a case where the second pad 202*a* is not covered by the first reinforcement plate 203, but it should be understood that, in order to prevent a portion of the main routing portion 202*b* that is connected to the second pad 202*a* from being oxidized, during the process of manufacturing the flexible circuit board 20, the first reinforcement plate 203 may cover a portion of the first connection portion 202a1 that is close to the main routing portion 202b to avoid the portion of the main routing portion 202b that is connected to the second pad 202a from being exposed.

In some embodiments, the flexible base plate 201 and the first reinforcement plate 203 of the flexible circuit board 20 may have a single-layer structure or a multi-layer structure; the flexible base plate 201 and the first reinforcement plate 203 may be made of PI (polyimide) or other materials. The first wiring layer may be made of Al (aluminum) or Cu (copper). In order to ensure the structural stability of the flexible circuit board 20, a thickness of the first reinforcement plate 203 may be greater than that of the second pad 202a.

In some embodiments, an oxidation resistant film with good conductivity (such as, a thin film of gold (Au) material, etc.) may be coated on the second pad 202a, thereby preventing a portion of the second pad 202a which is not covered by the first reinforcement plate 203 from being oxidized, to ensure good electrical conductivity of the second pad 202a. Since the oxidation resistant film is coated on the second pad 202a, the thickness of the second pad 202a is greater than that of the main routing portion 202b.

In some embodiments, the conductive adhesive may be an anisotropic conductive film (ACF), which utilizes the conductive particles 30 to bond the second pad 202a of the flexible circuit board 20 to the first pad 101 of the display panel 10, so as to make the flexible circuit board 20 be electrically connected to the display panel 10. Meanwhile, since the anisotropic conductive film is only conducted in a thickness direction of the flexible base plate 201, a short circuit between two adjacent pads in a horizontal direction may be avoided, so as to ensure the stable electrical connection between the flexible circuit board 20 and the display panel 10. In addition, since the anisotropic conductive film is only conducted in the thickness direction of the flexible base plate 201, the adhesive of the anisotropic conductive film may be arranged on the whole surface in the process of bonding a plurality of pairs of first pads 101 and second pads 202a, so as to reduce the bonding difficulty.

In some embodiments, the first reinforcement plate 203 is located at an outer side of the display panel 10 in the first direction. The first reinforcement plate 203 has a first edge facing the display panel 10. As described above, the first direction is the length direction of the first pad 101, that is, a direction in which the second pad 202a is away from the display panel 10. It should be noted that the first edge facing the display panel 10 means that the first edge E1 is an edge close to the display panel 10, and a whole extending trend of the first edge E1 is along the second direction.

Figure 7:
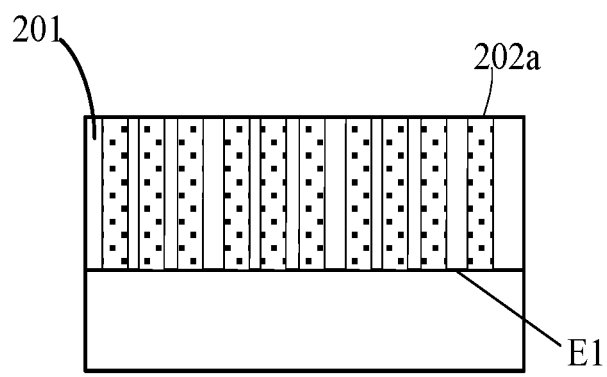
FIG. 7 is a bottom view of partial areas of a flexible circuit board provided in a comparison example.
Figure 8:
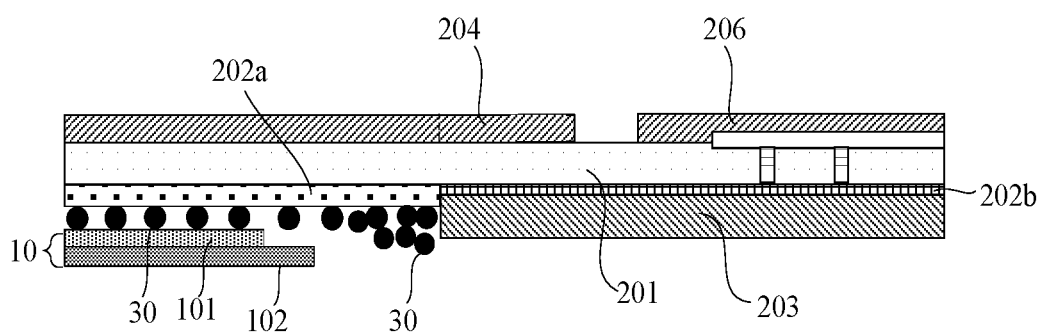
FIG. 8 is a schematic diagram of a connection between a flexible circuit board and a display panel in a comparison example.

FIG. 7 is a bottom view of partial areas of a flexible circuit board provided in a comparison example. FIG. 8 is a schematic diagram of a connection between a flexible circuit board and a display panel in a comparison example. In order to differentiate the flexible circuit board in the embodiment of the present disclosure from the flexible circuit board in the comparison example, the first edge E1 of the first reinforcement plate 203 is linear as shown in FIG. 7, an area having the same size as that in FIG. 4 is shown in FIG. 7. As shown in FIG. 7, in the comparison example, the first edge E1 of the first reinforcement plate 203 is in a straight line. At this time, as shown in FIG. 8, in the process of stitching and bonding the flexible circuit board 20 and the display panel 10, the conductive particles 30 in the conductive adhesive are discharged outwards due to a stitching force, so that a large amount of conductive particles 30 are accumulated on the cross section of the flexible circuit board 20 proximal to the display panel 10, and the reliability of the flexible circuit board 20 is deteriorated.

In order to disperse the conductive particles at the cross section of the flexible circuit board 20, in the embodiment of the present disclosure, the first edge E1 may have a wave shape. For example, as shown in FIGS. 4 and 6, the first edge E1 includes: convex portions E11 curved toward the display panel 10 and concave portions E12 curved away from the display panel 10, the convex portions E11 and the concave portions E12 are alternately arranged in the second direction, forming the wave shape. Compared with the straight edge in FIG. 7, the first edge E1 have the wave shape, which may increase a length of the first edge E1. Thus, when the conductive particles 30 in the conductive adhesive are discharged outwards due to a stitching force, the conductive particles may be dispersed along the first edge E1, thereby reducing or preventing the accumulation of the conductive particles and improving the reliability of the flexible circuit board.

In some embodiments, the convex portions E11 and the concave portions E12 both have smooth patterns to prevent the conductive particles 30 from accumulating at a certain position of the convex portions E11 and the concave portions E12. For example, the convex portions E11 and the concave portions E12 are both arc-shaped, so that the conductive particles in the conductive adhesive may be uniformly dispersed along the convex portions E11 and the concave portions E12.

Optionally, a radius of the convex portion E11 and a radius of the concave portion E12 are both in a range of 1.0 mm to 1.5 mm. For example, the radius of the convex portion E11 and the radius of the concave portion E12 are both 1.3 mm. It should be understood that the radius of the convex portion E11 (or the concave portion) refers to a radius of a circle on which the arc-shaped convex portion E12 (or the concave portion) is located.

In some embodiments, a length of each convex portion E11 in the second direction is equal to a length of each concave portion E12 in the second direction. It may be understood that when the length of the convex portion E11 in the second direction is equal to the length of the concave portion E12 in the second direction, and the radius of the convex portion E11 is equal to the radius of the concave portion E12, an arc length of each convex portion E11 is equal to an arc length of each concave portion E12, so that the uniform dispersion of the conductive particles 30 along the first edge E1 is facilitated.

In some embodiments, a connection line connecting one ends of the plurality of second pads 202a proximal to the first reinforcement plate 203 may have a substantially same shape as the first edge E1. For example, the one ends of the plurality of second pads 202a proximal to the main routing portion 202b are aligned with the first reinforcement plate 203, or a portion of each second pad 202a proximal to the main routing portion 202b is covered by the first reinforcement plate 203, and lengths of parts of respective second pads 202a covered by the first reinforcement plate 203 are equal to each other.

In some embodiments, any position of the first edge E1 of the first reinforcement plate 203 is spaced from the display panel 10, that is, any position of the first edge E1 of the first reinforcement plate 203 does not contact the display panel 10, so as to ensure that some conductive particles 30 may be smoothly discharged to a space between the first edge E1 and the first reinforcement plate 203 when being pressed and dispersed along the edge having the wave shape, thereby further ensuring the reliability of the flexible circuit board 20.

For example, a distance H1 between any position of the first edge E1 and the display panel 10 is between 200 μm and 1500 μm. Illustratively, in the production process, after the flexible circuit board 20 is bond with the display panel 10, a gluing is performed on the region in which the first edge E1 of the first reinforcement plate 203 and the display panel 10 are spaced from each other, so as to cover the portion of the first wiring layer exposed by the first reinforcement plate 203. At this time, the distance between the first edge E1 and the display panel 10 may be set according to a width of a gluing head. For example, if the width of the gluing head of a gluing device is 1000 μm, the nearest distance between the convex portion E11 of the first edge E1 and the display panel 10 is at least 200 μm, so as to prevent the conductive particles 30 in the conductive adhesive from accumulating; in addition, the farthest distance between the concave portion E12 of the first edge E1 and the display panel is not more than 1000 μm, so as to ensure that when the gluing device coats the adhesive on the region in which the first edge E1 and the display panel 10 are spaced from each other, the adhesive may cover the portion of the first wiring layer exposed by the first reinforcement plate 203.

In some embodiments, as shown in FIG. 6, the flexible circuit board 20 further includes a second reinforcement plate 204, which may be made of PI (polyimide) or the like. The second reinforcement plate 204 is located on a side of the flexible base plate 201 distal to the first wiring layer, at least includes a first reinforcement portion 204a; and an orthogonal projection of the second pad 202a on the flexible base plate 201 is located in an orthogonal projection of the first reinforcement portion 204a on the flexible base plate 201, so that the structural strength of a region of the flexible circuit board 20 where the second pad 202a is provided may be increased.

Optionally, the second reinforcement plate 204 further includes a second reinforcement portion 204b; the second reinforcement portion 204b and the first reinforcement portion 204a are sequentially arranged in the first direction; and an orthogonal projection of the second reinforcement portion 204b on the flexible base plate 201 is located within an orthogonal projection of the first reinforcement plate 203 on the flexible base plate 201. That is, a part of the second reinforcement plate 204 may also extend to a region of the flexible circuit board 20 where the main routing portion 202b is disposed; and a part of the second reinforcement plate 204 extending to the region where the main routing portion 202b is located is the second reinforcement portion 204. In this way, the rigid sudden change at an interface between the region where the second pad 202a is located and the region where the main routing portion 202b is located in the flexible circuit board 20 may be avoided, so that the situation that the interface is easily damaged in the process of stitching and bonding the second pad 202a and the first pad 101 may be avoided. That is: the problem is avoided that the second pad 202a and a position, where the second pad 202a and the main routing portion 202b are connected to each other, are easily broken, so as to ensure the structural stability of the flexible circuit board 20 in the bonding process.

Optionally, a dimension H2 of the second reinforcement portion 204b in the first direction is not less than 500 μm, so as to further prevent the second pad 202a and a position, where the second pad 202a and the main routing portion 202b are connected to each other, from being easily broken, and ensure the structural stability of the flexible circuit board 20 in the bonding process.

Note that an edge of the second reinforcement portion 204b distal to the first reinforcement portion 203 may be in a straight line, and since the first edge E1 of the first reinforcement plate 203 is not in a straight line, widths of the second reinforcement portion 204b at different positions are different from each other. The above "H2 is not less than 500 μm" means that the minimum width of the portion in which the second reinforcement plate 204 and the first reinforcement plate 203 are overlapped with each other in a thickness direction of the flexible base plate 201 is not less than 500 μm.

In some embodiments, as shown in FIG. 6, the flexible circuit board 20 further includes a second wiring layer 205 and a third reinforcement plate 206; the second wiring layer 205 is located on a side of the flexible base plate 201 distal to the first wiring layer and is electrically connected to the main routing portion 202b through a via 207, and may be made of Al (aluminum) or Cu (copper) and the like. The third reinforcement plate 206 is disposed on a side of the second wiring layer 205 distal to the flexible base plate 201, and may be made of PI (polyimide) and the like; an orthogonal projection of the second wiring layer 205 on the flexible base plate 201 is located in an orthogonal projection of the first reinforcement plate 203 on the flexible base plate 201, and is located in an orthogonal projection of the third reinforcement plate 206 on the flexible base plate 201. In the embodiment of the present disclosure, the flexible circuit board 20 is provided with two routing layers, which facilitates wiring, and the third reinforcement plate 206 is provided to protect the second wiring layer 205, and further enhance the structural strength of the flexible circuit board 20.

It should be noted that the flexible circuit board 20 may not only be provided with two routing layers, but also be provided with more layers (such as three layers, four layers, etc.) according to actual needs, which is not specifically limited herein.

In addition, there may be a plurality of vias 207 through which the first wiring layer and the second wiring layer 205 are connected to each other, to ensure connection stability between the first wiring layer and the second wiring layer 205.

In some embodiments, the third reinforcement plate 206 and the second reinforcement portion 204b have an interval 208 therebetween, so as to improve the bending capability of the flexible circuit board 20. A width of the interval 208 may be determined according to actual needs, which is not limited in detail herein in embodiments of the present disclosure.

In some embodiments, a part of the third reinforcement plate 206 is located on a side of the second wiring layer 205 proximal to the second reinforcement portion 204b, so as to cover an end of the second wiring layer 205 proximal to the second reinforcement portion 204b, avoiding the second wiring layer 205 from being oxidized, thereby ensuring that the second wiring layer 205 has good conductivity; while also avoiding the second wiring layer 205 from contacting by mistake with other conductive components at the interval 208.

The second reinforcement portion 204b and the first reinforcement portion 204a of the second reinforcement plate 204 may have a unitary structure, which is favorable for simplifying the manufacturing process. When the second reinforcement plate 204 and the third reinforcement plate 206 are manufactured, an entire film layer may be manufactured on a side of the flexible base plate 201 distal to the first circuit layer, and then, is cut or etched at a position corresponding to the interval 208, so as to form the second reinforcement plate 204 and the third reinforcement plate 206 which are disconnected from each other. It should be noted that the manufacturing process of the second reinforcement plate 204 and the third reinforcement plate 206 is not limited to this, and the two reinforcement plates may be formed separately, as the case may be.

The embodiment of the present disclosure further provides a display device which includes the display assembly in any one of the embodiments. The specific type of the display device is not particularly limited, and the types of the display devices commonly used in the art may be used, specifically, for example, a display screen, a mobile device such as a mobile phone, a wearable device such as a watch, a VR device, and the like. One of ordinary skill in the art may make a corresponding choice according to the specific use, and the description thereof is omitted here.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display assembly, comprising:
   a display panel comprising a display region and a bonding region on at least one side of the display region, wherein
   the display panel comprises: a substrate, a driving circuit, and a first pad, the driving circuit and the first pad are on the substrate, and the first pad is in the bonding region; the driving circuit is electrically connected to the first pad, and at least comprises a transistor in the display region, and a semiconductor layer of the transistor is embedded in the substrate;
   a flexible circuit board, comprising: a flexible base plate, a first wiring layer and a first reinforcement plate, wherein the first wiring layer is on the flexible base plate and comprises a main routing portion and a second pad, and the first reinforcement plate is on a side of the first wiring layer distal to the flexible base plate;
   an orthogonal projection of the main routing portion on the flexible base plate is within an orthogonal projection of the first reinforcement plate on the flexible base plate; the second pad is connected to the main routing portion, at least a part of the second pad is electrically connected to the first pad through a conductive adhesive, and the conductive adhesive comprises conductive particles;
   in a first direction, the first reinforcement plate is outside the display panel, has a first edge proximal to the display panel; the first edge comprises: convex portions bent towards the display panel, and concave portions bent away from the display panel, and the concave portions and the convex portions are alternately arranged in a second direction to form a wave shape; the first direction is a direction in which the second pad is away from the display panel, and the second direction intersects with the first direction;
   the convex portions and the concave portions are both arc-shaped;
   a length of each of the convex portions in the second direction is equal to a length of each of the concave portions in the second direction; and
   the conductive particles in the conductive adhesive are uniformly dispersed along the convex portions and the concave portions.

2. The display assembly of claim 1, wherein the convex portions and the concave portions each have a radius between 1.0 mm and 1.5 mm.

3. The display assembly of claim 1, wherein an arc length of each of the convex portions and an arc length of each of the concave portions are both between 0 mm and 1.6 mm.

4. The display assembly of claim 1, wherein any position of the first edge is spaced apart from the display panel by an interval.

5. The display assembly of claim 1, wherein the interval between any position of the first edge and the display panel is between 200 μm and 1500 μm.

6. The display assembly of claim 1, wherein the flexible circuit board further comprises a second reinforcement plate on a side of the flexible base plate distal to the first wiring layer, and at least comprising a first reinforcement portion, and an orthogonal projection of the second pad on the flexible base plate is within an orthogonal projection of the first reinforcement portion on the flexible base plate.

7. The display assembly of claim 6, wherein
   the second reinforcement plate further comprises a second reinforcement portion; and
   the second reinforcement portion and the first reinforcement portion are sequentially arranged in the first direction, and an orthogonal projection of the second reinforcement portion on the flexible base plate is within an orthogonal projection of the first reinforcement plate on the flexible base plate.

8. The display assembly of claim 7, wherein the first reinforcement portion and the second reinforcement portion of the second reinforcement plate are formed as a single piece.

9. The display assembly of claim 7, wherein a dimension of the second reinforcement portion in the first direction is not less than 500 μm.

10. The display assembly of claim 6, wherein
    the flexible circuit board further comprises a second wiring layer and a third reinforcement plate,
    the second wiring layer is on a side of the flexible base plate distal to the first wiring layer and is electrically connected to the main routing portion through a via; the third reinforcement plate is on a side of the second wiring layer distal to the flexible base plate;
    wherein an orthogonal projection of the second wiring layer on the flexible base plate is within an orthogonal projection of the first reinforcement plate on the flexible base plate, and is within an orthogonal projection of the third reinforcement plate on the flexible base plate.

11. The display assembly of claim 10, wherein the third reinforcement plate and the second reinforcement plate have an interval therebetween.

12. The display assembly of claim 10, wherein a part of the third reinforcement plate is on a side of the second wiring layer proximal to the second reinforcement portion.

13. The display assembly of claim 1, wherein the conductive adhesive is an anisotropic conductive adhesive.

14. The display assembly of claim 1, wherein the display panel further comprises:

a light-emitting element in the display region and on a side of the driving circuit distal to the substrate, and electrically connected to the transistor.

15. A display device, comprising the display assembly of claim 1.

16. The display assembly of claim 2, wherein the flexible circuit board further comprises a second reinforcement plate on a side of the flexible base plate distal to the first wiring layer, and at least comprising a first reinforcement portion, and an orthogonal projection of the second pad on the flexible base plate is within an orthogonal projection of the first reinforcement portion on the flexible base plate.

17. The display assembly of claim 3, wherein the flexible circuit board further comprises a second reinforcement plate on a side of the flexible base plate distal to the first wiring layer, and at least comprising a first reinforcement portion, and an orthogonal projection of the second pad on the flexible base plate is within an orthogonal projection of the first reinforcement portion on the flexible base plate.

* * * * *